(12) United States Patent
Hwang

(10) Patent No.: US 7,573,198 B2
(45) Date of Patent: Aug. 11, 2009

(54) PLASMA DISPLAY APPARATUS

(75) Inventor: Tae Hwa Hwang, Gyeongsangbuk-do (KR)

(73) Assignee: LG Electronics Inc., Seoul (KR)

( * ) Notice: Subject to any disclaimer, the term of this patent is extended or adjusted under 35 U.S.C. 154(b) by 435 days.

(21) Appl. No.: 11/480,365

(22) Filed: Jul. 5, 2006

(65) Prior Publication Data
US 2007/0080359 A1    Apr. 12, 2007

(30) Foreign Application Priority Data
Oct. 6, 2005    (KR) .................... 10-2005-0094046

(51) Int. Cl.
*H01J 1/62* (2006.01)
(52) U.S. Cl. ..................... 313/582; 313/586
(58) Field of Classification Search .......... 313/582–587
See application file for complete search history.

(56) References Cited

U.S. PATENT DOCUMENTS

2004/0106306 A1    6/2004    Miyamura et al. ............ 439/67

FOREIGN PATENT DOCUMENTS

| CN | 1256476 | 6/2000 |
|---|---|---|
| CN | 1402319 | 3/2003 |
| CN | 1619616 | 5/2005 |
| CN | 1638002 | 7/2005 |
| EP | 1 455 377 A2 | 9/2004 |
| JP | 2004-087940 | 3/2004 |

OTHER PUBLICATIONS

European Search Report dated Oct. 28, 2008.
European Search Report dated Jul. 31, 2008.

*Primary Examiner*—Vip Patel
(74) *Attorney, Agent, or Firm*—KED & Associates, LLP

(57) ABSTRACT

A plasma display apparatus comprises a plasma display panel comprising an electrode, a drive board and a connection unit adhered to a terminal of the drive board and electrically connected to the electrode.

17 Claims, 7 Drawing Sheets

PLASMA DISPLAY APPARATUS

This Nonprovisional application claims priority under 35 U.S.C. §119(a) on Patent Application No. 10-2005-0094046 filed in Korea on Oct. 6, 2005 the entire contents of which are hereby incorporated by reference.

BACKGROUND OF THE INVENTION

1. Field of the Invention

This document is related to a plasma display apparatus.

2. Description of the Background Art

Generally, a plasma display apparatus comprises a plasma display panel in which a plurality of electrodes are formed and a driver for the plurality of electrodes.

The plasma display apparatus displays an image through the plasma display panel. A main discharge gas such as Ne, He, an mixture gas of Ne and He, and an inert gas comprising Xe are filled in each cell of the plasma display panel. When a high frequency voltage is supplied to the plurality of electrodes of the plasma display panel, the inert gas generates vacuum ultraviolet rays, and a phosphor formed on a barrier rib emits light.

The driver of the plasma display apparatus supplies a driving signal to the plurality of electrodes of the plasma display panel. A reset discharge, an address discharge, and a sustain discharge generate in the cell of the plasma display panel in response to the supply of the driving signal. When the discharge generates in the cell, the discharge gas generates the vacuum ultraviolet rays. As the vacuum ultraviolet rays excite the phosphor, the image is displayed.

The driver of the plasma display apparatus is connected to at least one of a scan electrode, a sustain electrode, or an address electrode of the plasma display panel. When a connection between the driver and the electrode is unstable, the plasma display apparatus may malfunction or may not operate. Accordingly, the connection between the driver and the electrode have to be stable.

SUMMARY OF THE INVENTION

A plasma display apparatus in accordance with an embodiment of the present invention comprises a plasma display panel comprising an electrode, a drive board, and a connection unit adhered to a terminal of the drive board and electrically connected to the electrode.

A plasma display apparatus in accordance with another embodiment of the present invention comprises a plasma display panel comprising an electrode, a drive board, a connection unit for electrically connecting the electrode to the drive board and an adhering unit for adhering a terminal of the drive board to one terminal of the connection unit.

A plasma display apparatus in accordance with another embodiment of the present invention comprises a plasma display panel comprising an electrode, a drive board, a connection unit for electrically connecting the electrode to the drive board, a first adhering unit for electrically connecting the driver board and the connection unit by an adherence of a terminal of the drive board and one terminal of the connection unit and a second adhering unit for electrically connecting the connection unit and the electrode by an adherence the other terminal of the connection unit and the electrode.

BRIEF DESCRIPTION OF THE DRAWINGS

The embodiment of the invention will be described in detail with reference to the following drawings in which like numerals refer to like elements.

DETAILED DESCRIPTION OF PREFERRED EMBODIMENTS

A plasma display apparatus in accordance with an embodiment of the present invention comprises a plasma display panel comprising an electrode, a drive board, and a connection unit adhered to a terminal of the drive board and electrically connected to the electrode.

The connection unit may be any one of a tape carrier package (TCP), a chip-on-film (COF) and a flexible printed circuit (FPC).

The terminal of the drive board and the connection unit may be adhered to each other using an anisotropic conductive film (ACF).

The electrode may comprise any one of a scan electrode, a sustain electrode and an address electrode.

The drive board may comprise any one of a scan drive board, a sustain drive board and a data drive board.

The electrode may be adhered to the connection unit.

The electrode and the connection unit may be adhered to each other using an anisotropic conductive film (ACF).

A plasma display apparatus in accordance with another embodiment of the present invention comprises a plasma display panel comprising an electrode, a drive board, a connection unit for electrically connecting the electrode to the drive board and an adhering unit for adhering a terminal of the drive board to one terminal of the connection unit.

The plasma display apparatus in accordance with another embodiment of the present invention may further comprise another adhering unit for adhering the other terminal of the connection unit to the electrode.

The another adhering unit may comprise an anisotropic conductive film (ACF).

The plasma display apparatus in accordance with another embodiment of the present invention may further comprise a flame-retardant resin covering the connection unit, the adhering unit and a terminal of the drive board.

The flame-retardant resin may comprise at least one of a halogen-based material, aluminum based resin, phosphor based resin and melamine based resin, and ultraviolet-hardening resin.

A plasma display apparatus in accordance with another embodiment of the present invention comprises a plasma display panel comprising an electrode, a drive board, a connection unit for electrically connecting the electrode to the drive board, a first adhering unit for electrically connecting the driver board and the connection unit by an adherence of a terminal of the drive board and one terminal of the connection unit and a second adhering unit for electrically connecting the connection unit and the electrode by an adherence the other terminal of the connection unit and the electrode.

Embodiments of the present invention will be described in a more detailed manner with reference to the drawings.

A plasma display panel in accordance with an embodiment of the present invention comprises a plasma display panel through which an image is displayed and a driver supplying a driving signal to the plasma display panel.

Figure 1:
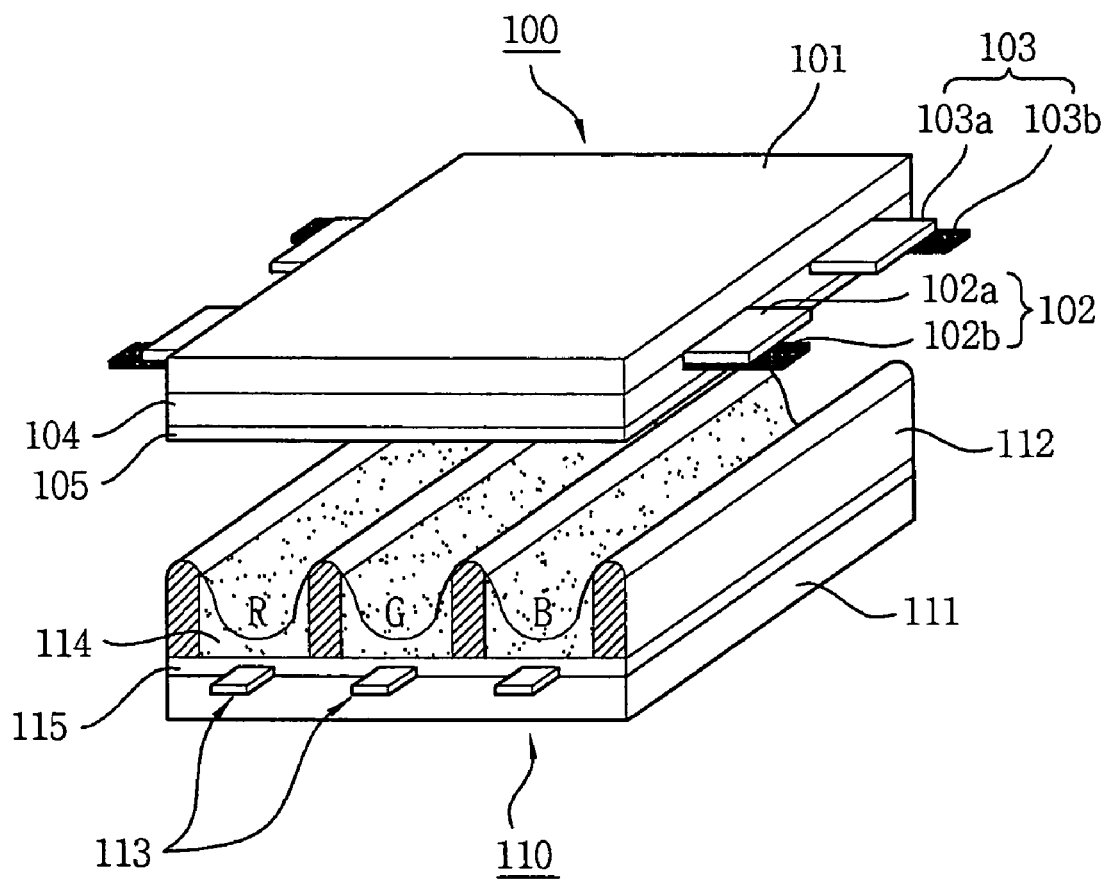
FIG. 1 shows a plasma display panel in accordance with an embodiment of the present invention.

FIG. 1 shows the plasma display panel in accordance with an embodiment of the present invention. As shown in FIG. 1, the plasma display panel in accordance with an embodiment of the present invention comprises a front panel 100 comprising a front substrate 101 on which a scan electrode 102 and a sustain electrode 103 are formed, and a rear panel 110 comprising a rear substrate 111 on which a plurality of address electrodes 113. The front panel 100 and the rear panel 110 are is coupled in in parallel at a given distance therebetween.

Each of the scan electrode 102 and the sustain electrode 103 comprises a transparent electrode 102a and 103a comprising ITO, and a bus electrode 102b and 103b comprising metal material. An upper dielectric layer 104 is formed on the scan electrode 102 and the sustain electrode 103, and insulates between the electrodes. A protective layer 105 is formed by a deposition of Mgo, protects the scan electrode 102 and the sustain electrode 103, and facilitates an emission of secondary electrons.

A lower dielectric layer 115 is formed on the address electrode 113, and insulates between address electrodes 113. A barrier rib 112 is formed on the lower dielectric layer 115, forms a discharge cell with a discharge space. A phosphor 114 is formed between the barrier ribs 112.

A driver of the plasma display apparatus is electrically connected by an adhesion to at least one of the scan electrode 102, the sustain electrode 103, or the address electrode 113. The adhesion of the driver and the electrode will be described in detail below.

Figure 2:
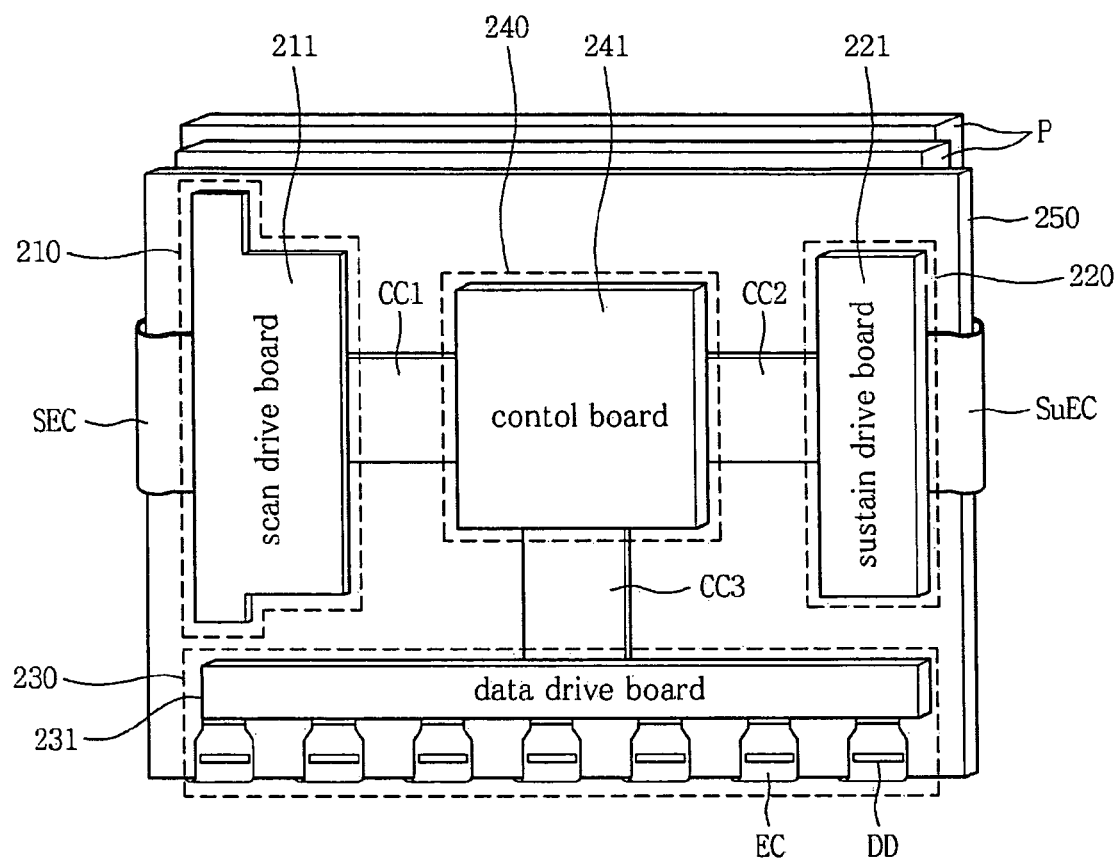
FIG. 2 shows a plasma display apparatus in accordance with the embodiment of the present invention.
Figure 3:
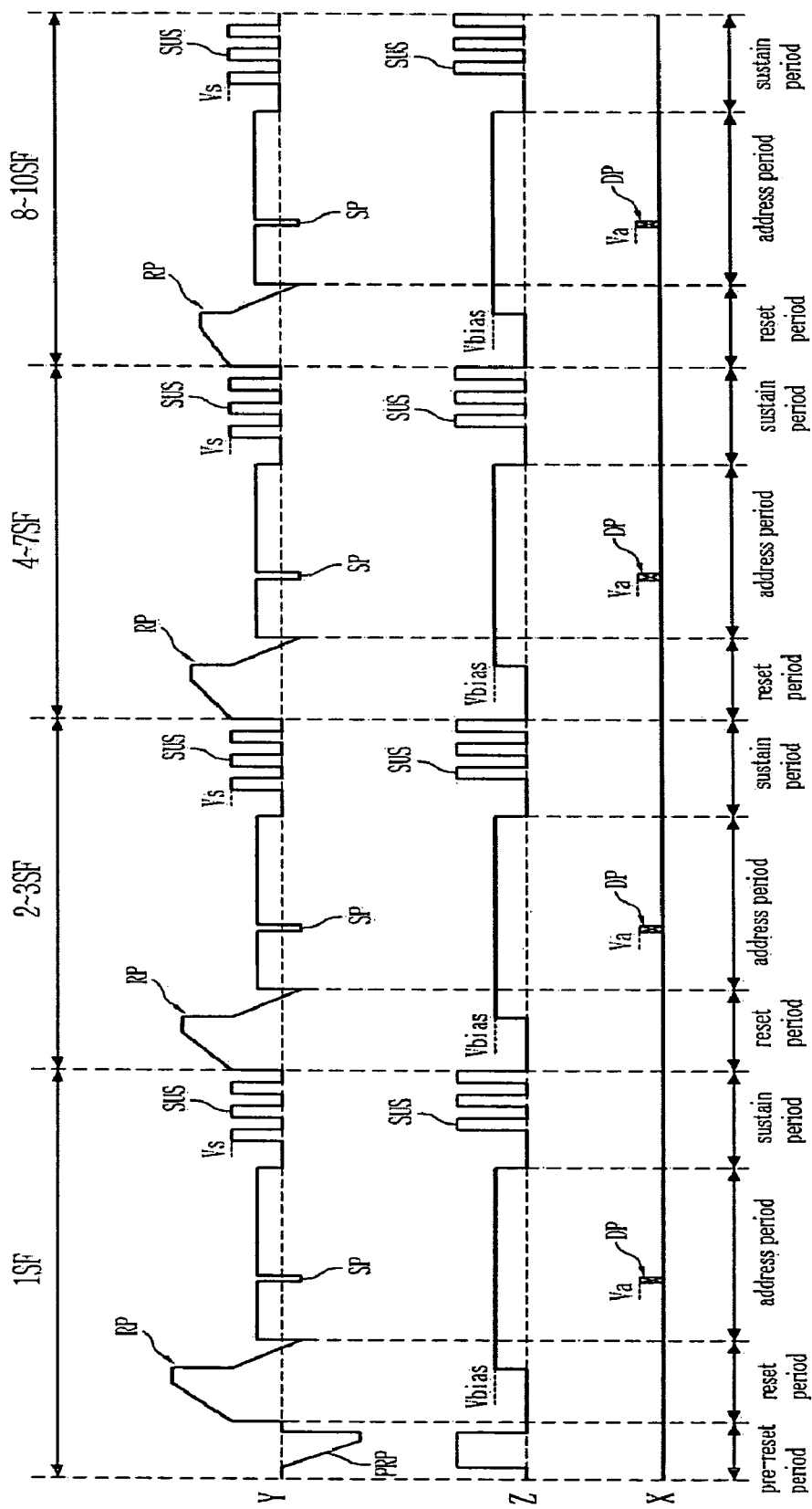
FIG. 3 shows a driving signal of the plasma display apparatus in accordance with the embodiment of the present invention.

FIG. 2 shows a plasma display apparatus in accordance with the embodiment of the present invention, and FIG. 3 shows a driving signal of the plasma display apparatus in accordance with the embodiment of the present invention. As shown in FIG. 2, the plasma display apparatus in accordance with an embodiment of the present invention comprises a plasma display panel P, a scan driver 210, a sustain driver 220, a data driver 230, a controller 240, a heat dissipation plate 250, a first control connection unit CC1, a second connection unit CC2, a third connection unit CC3, a scan connection unit SEC, a sustain connection unit SuEC, and a data connection unit EC.

The plasma display panel P comprises a scan electrode, a sustain electrode and an address electrode.

The scan driver 210 supplies a pre-reset signal PRP of FIG. 3 gradually falling to form enough wall charges, to the scan electrode Y in a pre-reset period. The scan driver 210 supplies a reset signal RP for initiating a discharge cell, a scan signal SP for selecting the discharge cell, and a sustain signal SUS for a sustain discharge of the selected discharge cell, to the scan electrode Y. The scan driver 210 comprises a scan driver board 211. A circuit for the supply of the reset signal RP, the scan signal SP, and the sustain signal SUS, is formed at the scan driver board 211. The scan driver 210 may supply reset signals RP having different magnitudes to the scan electrode Y. Since wall charges are formed sufficiently, the maximum voltage magnitudes of the reset signals supplied in subfields 2SF to 10SF which follow a first subfield may be less than the maximum voltage magnitude of the reset signal supplied in the first subfield 1SF.

The sustain driver 220 supplies a positive voltage corresponding to the pre-reset signal PRP, a bias voltage Vbias, and a sustain signal SUS for the sustain discharge of the selected discharge cell, to the sustain electrode Z. The sustain driver 220 comprises a sustain driver board 221. A circuit for the supply of the positive voltage, the bias voltage, and the sustain signal at the sustain driver board 221.

The data driver 230 supplies a data signal DP corresponding to the scan signal SP for a selection of the discharge cell, to the address electrode X. The data driver 230 comprises a data driver board 231 and a data connection unit EC. A circuit for the supply of a data voltage which is the maximum voltage of the data signal DP and for the transmission of an image signal, is formed at the data driver board 231. The data connection unit EC receives the data voltage Va from the data driver board 231, and outputs the data signal DP corresponding to the image signal to the address electrode X. The data connection unit EC comprises a data drive IC DD for generating the data signal. The data connection unit EC is electrically connected to the data drive board 231 by an adhesion unit (not shown). The data connection unit EC may be connected to the address electrode by the adhesion unit. The adhesion unit has a conductivity at a region where the data connection unit EC overlaps a terminal of the data drive board 231 or the address electrode, and has an insulating characteristic at a region where the data connection unit EC overlaps a terminal of the data drive board 231 or the address electrode. The adhesion unit improves an electrical stability against foreign materials or a force applied from the outside. The adhesion unit will be described in detail below.

The controller 240 outputs a timing control signal to the scan driver 210, a sustain driver 220, and the data driver 230, performs an image processing such as an inverse-gamma correction, a half-toning, a subfield-mapping, and a subfield arrangement, and outputs the image signal. The controller 240 comprises a control board 241. A circuit for forming the timing control signal and a circuit for performing the image processing, are formed at the control board 241.

The first control connection unit CC1 and the second control connection unit CC2 transmit the timing control signal outputted from the controller 240 to the scan driver 210 and the sustain driver 220, and the third connection unit CC3 transmits the timing control signal and the image signal outputted from the controller 240 to the data driver 230.

The scan connection unit SEC electrically connects the scan driver 210 and the scan electrode of the plasma display panel P.

The sustain connection unit SuEC electrically connects the sustain driver 220 and the sustain electrode of the plasma display panel P.

The heat-dissipation plate 250 dissipates heat generated by the plasma display panel P, the scan driver 210, the sustain driver 220, the data driver 230, and the controller 240, to the outside.

The data connection unit EC is described in detail with reference to FIG. 4.

Figure 4:
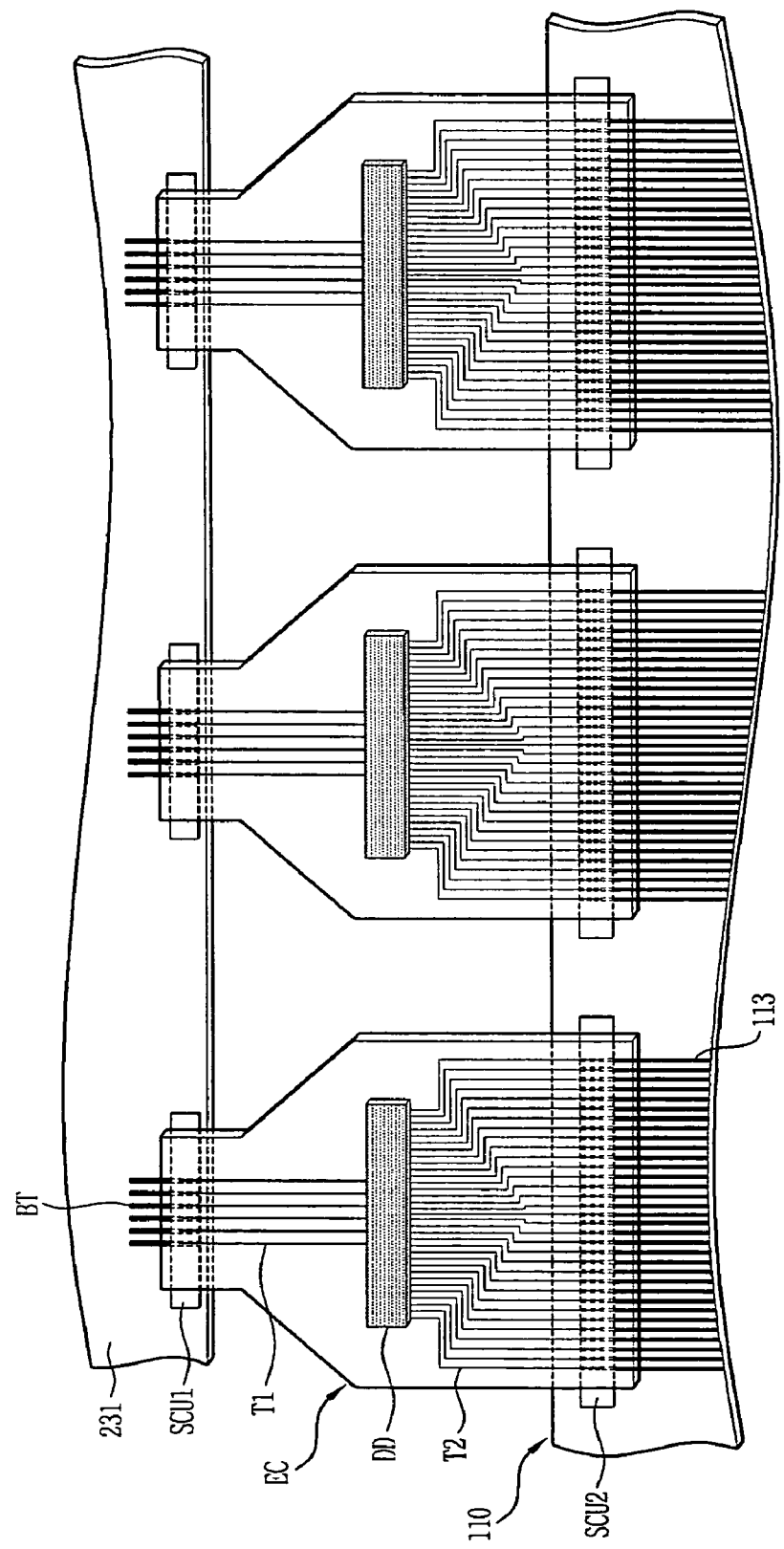
FIG. 4 shows a connection unit and an adhering unit of the plasma display apparatus in accordance with the embodiment of the present invention.

FIG. 4 shows the connection unit and the adhering unit of the plasma display apparatus in accordance with the embodiment of the present invention. As shown in FIG. 4, a terminal BT of the data drive board 231 and a first terminal T1 of the data connection unit EC, are electrically connected each other by a first adhesion unit SCU1. Accordingly, the data voltage or the image signal outputted from the data drive board 231, are inputted to the data drive IC DD. The first adhesion unit SCU1 comprises an anisotropic conductive film. A second terminal T2 and the address electrode may be electrically connected each other by a second adhesion unit SCU2. The second adhesion unit SCU2 may comprise an anisotropic conductive film. Accordingly, the data signal corresponding to the image signal outputted from the data drive IC DD, is supplied to the address electrode 113. The data connection unit EC may be any one of a tape carrier package (TCP), a chip on film (COF), or a flexible printed circuit.

In the embodiment of the present invention, the data connection unit EC is adhered to the data drive board 231 and the address electrode of the plasma display panel P by the first adhesion unit SCU1 and the second adhesion unit SCU2. However, at least one of the scan drive board 211 and the sustain drive board 221 may be adhered to at least one of the scan connection unit SEC or the sustain connection unit SuEC by the adhesion unit such as the anisotropic conductive film.

At least one of the scan connection unit SEC and the sustain connection unit SuEC may be adhered to the scan electrode or the sustain electrode of the plasma display panel P by the adhesion unit such as the anisotropic conductive film. The scan connection unit SEC or the sustain connection unit SuEC is any one of a tape carrier package (TCP), a chip on film (COF), or a flexible printed circuit (FPC).

The anisotropic conductive film will be described in detail with reference to FIG. 5a to FIG. 5e.

FIG. 5a to FIG. 5e show a forming process of the adhering unit of the plasma display apparatus in accordance with the embodiment of the present invention. The adhesion unit in FIG. 5a to FIG. 5e comprises the anisotropic conductive film.

The anisotropic conductive film is a tape type adhesion material comprising an adhesion material resin where conductive particles are dispersed, and can connect a plurality of high-density circuits. Heat and pressure is applied to the anisotropic conductive film after the anisotropic conductive film is inserted between a connection unit and at least of a drive board and an electrode of the plasma display panel. Accordingly, the anisotropic conductive film adheres the drive board to the connection unit, and electrically connects the drive board and the connection unit. The anisotropic conductive film provides a conductivity in a region where a terminal of the connection unit overlaps a terminal of the drive board or an electrode of the plasma display panel. The drive board may be any one of the scan drive board 211, the sustain drive board 221, and the data drive board 231.

Figure 5A:
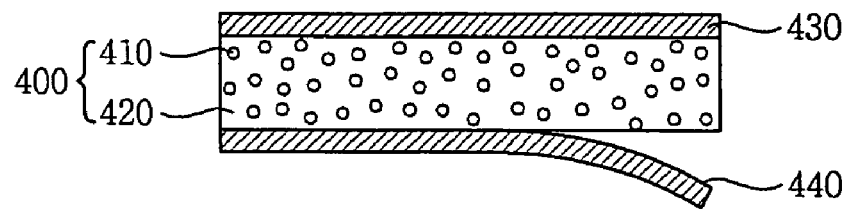
FIG. 5a to FIG. 5e show a forming process of the adhering unit of the plasma display apparatus in accordance with the embodiment of the present invention.

As shown in FIG. 5a, the anisotropic conductive film comprises a film layer 400 comprising an adhesive resin 420 where the conductive particles 410 are dispersed. The conductive particles 410 comprise a plastic particle or a metal particle on which a metal is coated. A first protective film 430 and a second protective film 440 for protecting the film layer 400 from foreign materials, are adhered to a first surface and a second surface of the film layer 400. The second protective film 440 is removed from the isotropic conductive film 400 for an adhesion of the film layer 400.

Figure 5B:
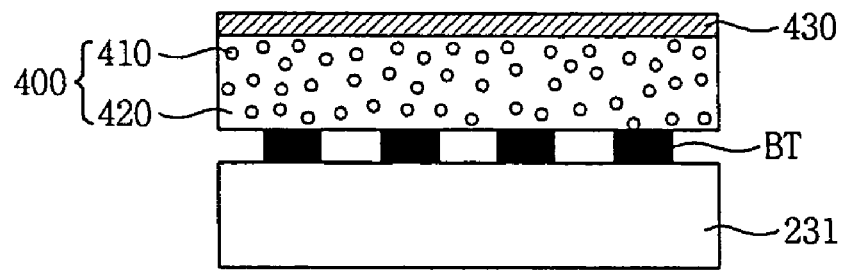
Figure 5C:
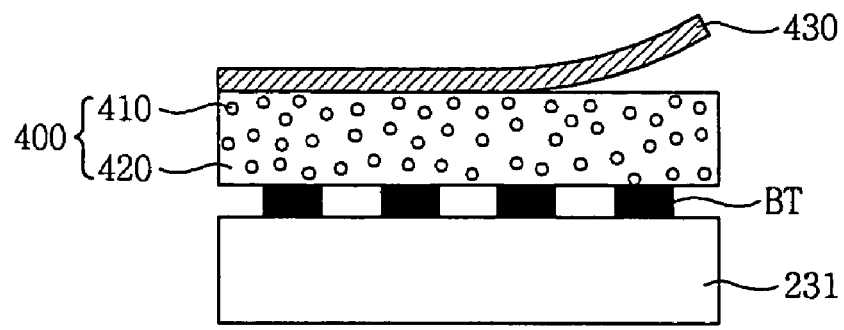

As shown in FIG. 5b, The second surface of the film layer 400 is disposed on the terminal BT of the data drive board 231. As shown in FIG. 5c, the first protective film 402 is removed from the film layer 400.

Figure 5D:
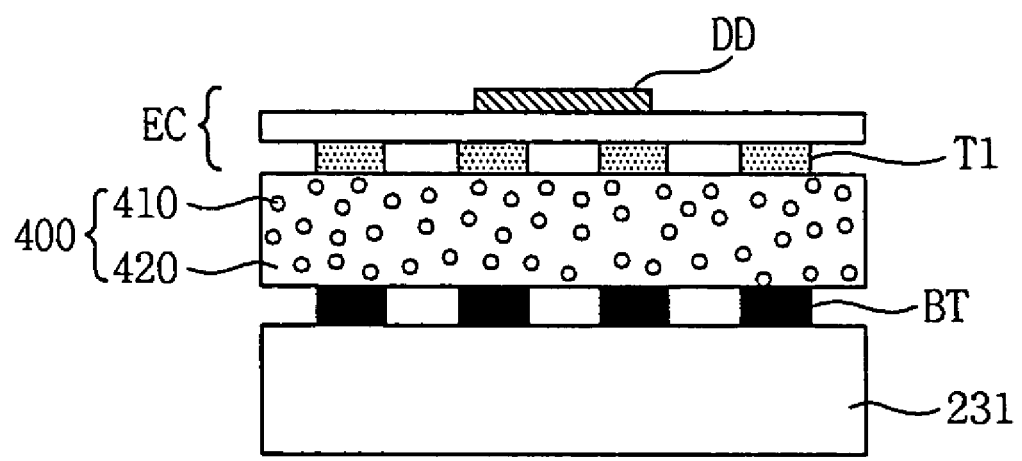

As shown in FIG. 5d, the data connection unit EC where the integrated circuit 413 is mounted is disposed on the first surface of the film layer 400. The first terminal of the data connection unit EC is aligned with the terminal BT of the data drive board 231.

Figure 5E:
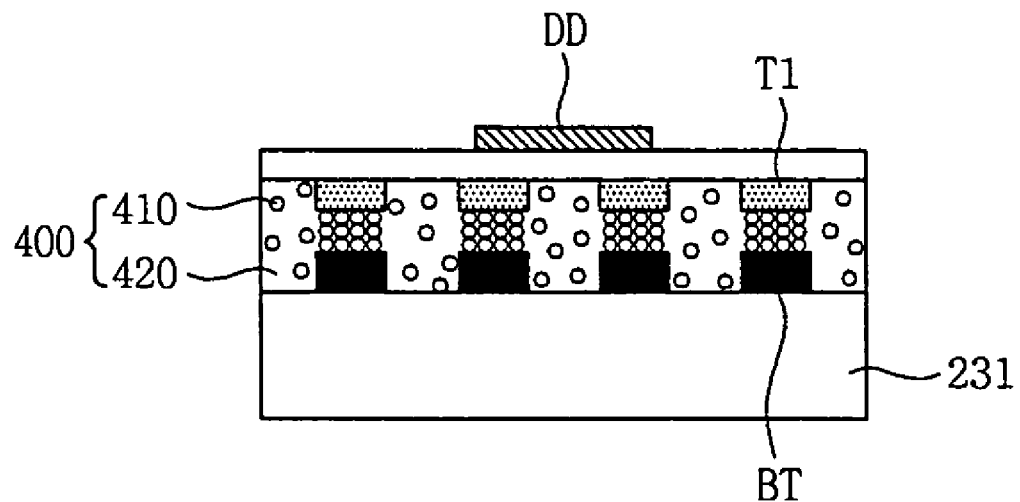

As shown in FIG. 5e, a pressure is applied to the data connection unit EC and the data drive board 231 by a press applying tool (not shown) at 160° C. to 180° C. The adhesion material resin 420 is melted by heat, and a distance between the first terminal T1 of the data connection unit EC and the terminal of the data drive board 231, is reduced because of an application of the pressure. The conductive particles 410 between the first terminal T1 of the data connection unit EC and the terminal BT of the data drive board 231, contacts to an adjacent conductive particles, and the conductive particles in a region between the first terminals of the data connection unit EC, are separated from each other. That is to say, a dispersion density of the conductive particle at the region where the first terminal T1 overlaps the terminal BT of the data drive board 231, is more than the dispersion density of the conductive particle at the rest region.

Accordingly, the first terminal T1 of the data connection unit EC is electrically connected to the terminal BT of the data drive board 231, and the first terminals of the data connection unit EC are insulated from each other.

As shown in FIG. 5e, when the data drive board 231 is electrically connected to the data connection unit EC by the adhesion unit such as the isotropic conductive film, a contact failure or an inflow of foreign materials between the data drive board 231 and the data connection unit EC are prevented, and an electrical connection between the driver of the plasma display apparatus and the electrode become stable.

An electrical connection of the data connection unit EC and the data drive board 231 is illustrated in FIG. 5a to 5e. However, the data connection unit EC may be connected to the address electrode of the plasma display panel by the adhesion unit.

The connection of the data connection unit EC and the data drive board 231 by the adhesion unit is described in the embodiment of the present invention, however, the data connection unit EC may be electrically connected to at least one of the scan driver board 211 and the sustain driver board 221 by the adhesion unit.

The scan connection unit SEC or the sustain connection unit SuEC may be electrically connected to the scan electrode or the sustain electrode by the adhesion unit.

Figure 6:
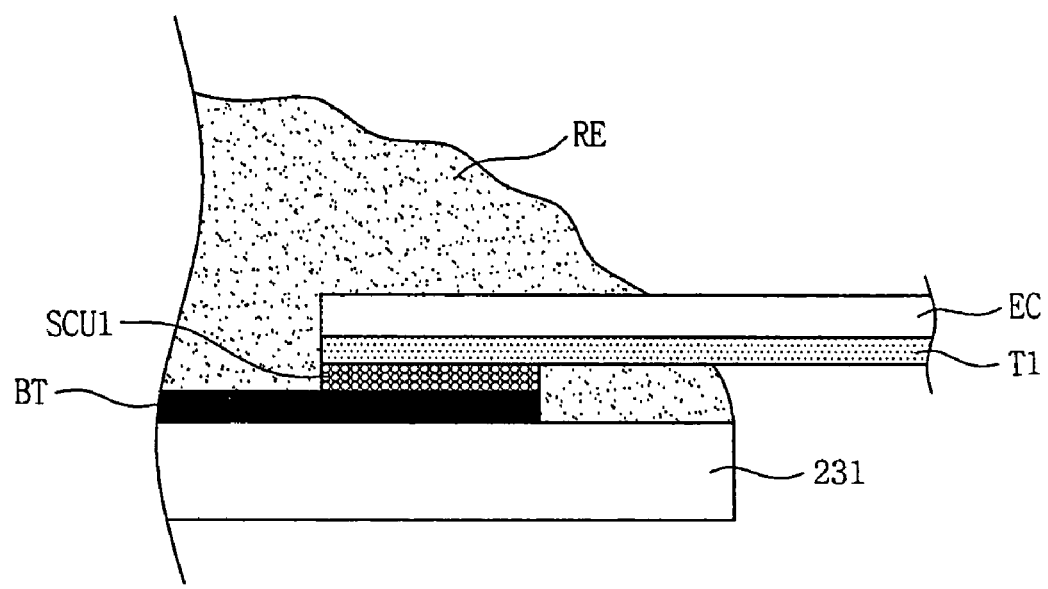
FIG. 6 shows a plasma display apparatus in accordance with another embodiment of the present invention.

FIG. 6 shows a plasma display apparatus in accordance with another embodiment of the present invention. As shown in FIG. 6, the plasma display apparatus in accordance with another embodiment of the present invention further comprises a flame retardant resin RE covering a data connection unit EC, a first adhesion unit SCU1, and a data drive board 231. The flame retardant resin RE protects a terminal BT of the data drive board 231 from moisture or corrosive gas, and protects the first adhesion unit SCU1 by an absorption of heat generated during an operation of the plasma display apparatus. The flame retardant material comprises at least one of a halogen-based material such as bromine (Br), aluminum (Al) based resin, phosphor (P) based resin and melamine based resin. The flame retardant material comprises ultraviolet-hardening resin. The ultraviolet-hardening resin comprises at least one of oligomer or monomer.

The embodiment of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A plasma display apparatus, comprising:
a plasma display panel including an electrode;
a drive board; and
a connection unit adhered to a terminal of the drive board and electrically connected to the electrode, wherein the terminal of the drive board and a terminal of the connection unit are adhered to each other using an anisotropic conductive film (ACF), and wherein a dispersion density of conductive particles at a region of the anisotropic conductive film where the terminal of the connection unit overlaps the terminal of the data drive board is greater than a dispersion density of conductive particles at a remaining region of the anisotropic conductive film.

2. The plasma display apparatus of claim 1, wherein the connection unit is any one of a tape carrier package (TCP), a chip-on-film (COF) or a flexible printed circuit (FPC).

3. The plasma display apparatus of claim 1, wherein the electrode comprises any one of a scan electrode, a sustain electrode or an address electrode.

4. The plasma display apparatus of claim 1, wherein the drive board comprises any one of a scan drive board, a sustain drive board or a data drive board.

5. The plasma display apparatus of claim 1, wherein the electrode is adhered to the connection unit.

6. The plasma display apparatus of claim 5, wherein the electrode and the connection unit are adhered to each other using an anisotropic conductive film (ACF).

7. A plasma display apparatus, comprising:
a plasma display panel including an electrode;
a drive board;
a connection unit that electrically connects the electrode to the drive board; and
a first adhering unit that adheres a first terminal of the drive board to a first terminal of the connection unit, wherein the first adhering unit comprises an anisotropic conductive film (ACF), and wherein a dispersion density of conductive particles at a region of the anisotropic conductive film where the first terminal of the connection unit overlaps the first terminal of the drive board is greater than a dispersion density of conductive particles at a remaining region of the anisotropic conductive film.

8. The plasma display apparatus of claim 7, wherein the connection unit is any one of a tape carrier package (TCP), a chip-on-film (COF) or a flexible printed circuit (FPC).

9. The plasma display apparatus of claim 8, further comprising a second adhering unit that adheres a second terminal of the connection unit to the electrode.

10. The plasma display apparatus of claim 9, wherein the second adhering unit comprises an anisotropic conductive film (ACF).

11. The plasma display apparatus of claim 7, wherein the electrode comprises any one of a scan electrode, a sustain electrode or an address electrode.

12. The plasma display apparatus of claim 7, wherein the drive board comprises any one of a scan drive board, a sustain drive board or a data drive board.

13. The plasma display apparatus of claim 7, further comprising a flame-retardant resin covering the connection unit, the first adhering unit and the first terminal of the drive board.

14. The plasma display apparatus of claim 13, wherein the flame-retardant resin comprises at least one of a halogen-based material, aluminum based resin, phosphor based resin and melamine based resin, or ultraviolet-hardening resin.

15. A plasma display apparatus comprising:
a plasma display panel including an electrode;
a drive board;
a connection unit that electrically connects the electrode to the drive board;
a first adhering unit that electrically connects the drive board and the connection unit by an adherence of a terminal of the drive board and a first terminal of the connection unit; and
a second adhering unit that electrically connects the connection unit and the electrode by an adherence of a second terminal of the connection unit and the electrode, wherein the first adhering unit or the second adhering unit comprises an anisotropic conductive film (ACF), wherein a dispersion density of conductive particles at a region of the anisotropic conductive film where the first terminal of the connection unit overlaps the terminal of the drive board is greater than a dispersion density of conductive particles at a remaining region of the anisotropic conductive film, and wherein a dispersion density of conductive particles at a region of the anisotropic conductive film where the second terminal of the connection unit overlaps the electrode is greater than a dispersion density of conductive particles at a remaining region of the anisotropic conductive film.

16. The plasma display apparatus of claim 15, wherein the connection unit is any one of a tape carrier package (TCP), a chip-on-film (COF) or a flexible printed circuit (FPC).

17. The plasma display apparatus of claim 15, wherein the electrode comprises any one of a scan electrode, a sustain electrode or an address electrode.

* * * * *